(12) United States Patent
Tan et al.

(10) Patent No.: US 7,045,072 B2
(45) Date of Patent: May 16, 2006

(54) CLEANING PROCESS AND APPARATUS FOR SILICATE MATERIALS

(76) Inventors: Samantha S. H. Tan, 4715 Finn Cove Ct., Union City, CA (US) 94587; Ning Chen, 39651 Blacow Rd., Fremont, CA (US) 94538

( * ) Notice: Subject to any disclaimer, the term of this patent is extended or adjusted under 35 U.S.C. 154(b) by 30 days.

(21) Appl. No.: 10/627,185

(22) Filed: Jul. 24, 2003

(65) Prior Publication Data
US 2005/0016958 A1    Jan. 27, 2005

(51) Int. Cl.
B44C 1/22 (2006.01)
C03C 15/00 (2006.01)
C03C 25/68 (2006.01)
C23F 1/00 (2006.01)

(52) U.S. Cl. .......................... 216/52; 216/83
(58) Field of Classification Search .............. 216/52, 216/80, 99, 79; 438/691, 690, 704, 723, 438/746, 756
See application file for complete search history.

(56) References Cited

U.S. PATENT DOCUMENTS

| | | |
|---|---|---|
| 3,775,202 A | 11/1973 | Meek et al. |
| 3,969,195 A | 7/1976 | Dötzer et al. |
| 3,986,653 A | 10/1976 | Gilding |
| 3,992,454 A | 11/1976 | Kessler |
| 4,023,936 A | 5/1977 | Morse et al. |
| 4,078,963 A | 3/1978 | Symersky |
| 4,101,386 A | 7/1978 | Dötzer et al. |
| 4,139,348 A | 2/1979 | Swartz |
| 4,197,631 A | 4/1980 | Meyer et al. |
| 4,214,952 A | 7/1980 | Sato et al. |
| 4,232,060 A | 11/1980 | Mallory, Jr. |
| 4,272,612 A | 6/1981 | Oliver |
| 4,327,134 A | 4/1982 | Baldi |
| 4,367,119 A | 1/1983 | Logan et al. |
| 4,447,824 A | 5/1984 | Logan et al. |
| 4,448,800 A | 5/1984 | Ehara et al. |
| 4,459,155 A | 7/1984 | Cayless |
| 4,519,914 A | 5/1985 | Etani |
| 4,530,120 A | 7/1985 | Etani |

(Continued)

FOREIGN PATENT DOCUMENTS

JP            50087974 A  *  7/1975

(Continued)

OTHER PUBLICATIONS

Hoffman, H.S., Molybdenum Cleaning Solution, *IBM Technical Disclosure Bulletin*, 3(5):36, (1960).

(Continued)

*Primary Examiner*—Parviz Hassanzadeh
*Assistant Examiner*—Roberts Culbert
(74) *Attorney, Agent, or Firm*—Dugan & Dugan, PC

(57) ABSTRACT

A method for treating a surface of a quartz substrate includes preparing a substrate to provide a working surface having an initial roughness; and then ultrasonically acid-etching the working surface to increase the roughness of the working surface by at least about 10%. In one embodiment, the initial surface roughness is greater than about 10 Ra, and in another embodiment the initial surface roughness is greater than about 200 Ra. In a still further embodiment, the initial surface area, if less than about 200 Ra, is increased to greater than about 200 Ra. In other embodiments of the present invention, the working surface roughness is increased by at least about 25% or at least about 50%. Simultaneous with the increase in surface area (as measured by the roughness), the surface defects are reduced to reduce particulate contamination from the substrate.

4 Claims, 11 Drawing Sheets

U.S. PATENT DOCUMENTS

| | | | |
|---|---|---|---|
| 4,579,569 A | 4/1986 | Sheng et al. | |
| 4,638,553 A | 1/1987 | Nilarp | |
| 4,699,082 A | 10/1987 | Hakim | |
| 4,863,561 A | 9/1989 | Freeman et al. | |
| 4,957,583 A * | 9/1990 | Buck et al. | 156/345.11 |
| 4,971,590 A | 11/1990 | Tong | |
| 4,980,017 A | 12/1990 | Kaji et al. | |
| 5,104,501 A | 4/1992 | Okabayashi | |
| 5,152,878 A | 10/1992 | Datta et al. | |
| 5,221,421 A | 6/1993 | Leibovitz et al. | |
| 5,365,112 A | 11/1994 | Ohshima | |
| 5,516,399 A | 5/1996 | Balconi-Lamica et al. | |
| 5,593,339 A | 1/1997 | Yam et al. | |
| 5,614,027 A | 3/1997 | Dunn et al. | |
| 5,665,473 A | 9/1997 | Okoshi et al. | |
| 5,712,198 A | 1/1998 | Shive et al. | |
| 5,744,214 A | 4/1998 | Berasi et al. | |
| 5,766,979 A | 6/1998 | Budnaitis | |
| 5,840,402 A | 11/1998 | Roberts et al. | |
| 5,888,308 A | 3/1999 | Sachdev et al. | |
| 5,891,354 A | 4/1999 | Lee et al. | |
| 5,908,819 A | 6/1999 | Reynolds et al. | |
| 5,929,521 A | 7/1999 | Wark et al. | |
| 5,966,593 A | 10/1999 | Budnaitis et al. | |
| 6,012,966 A | 1/2000 | Ban et al. | |
| 6,187,216 B1 | 2/2001 | Dryer et al. | |
| 6,368,410 B1 * | 4/2002 | Gorczyca et al. | 118/715 |
| 6,506,254 B1 | 1/2003 | Bosch et al. | |
| 6,569,252 B1 | 5/2003 | Sachdev et al. | |
| 6,579,153 B1 | 6/2003 | Uchikura et al. | |
| 6,767,840 B1 | 7/2004 | Uehara et al. | |
| 2003/0000458 A1 * | 1/2003 | Marumo et al. | 117/200 |
| 2003/0091835 A1 * | 5/2003 | Takahashi et al. | 428/432 |
| 2003/0096562 A1 | 5/2003 | Kurogouchi | |
| 2004/0000327 A1 * | 1/2004 | Somboli et al. | 134/21 |
| 2004/0060579 A1 | 4/2004 | Kim et al. | |
| 2004/0238487 A1 * | 12/2004 | Kiehlbauch et al. | 216/52 |

FOREIGN PATENT DOCUMENTS

| | | |
|---|---|---|
| JP | 11-290805 | 10/1999 |

OTHER PUBLICATIONS

*Metrology for Manufacturing:* Surface Measurement. [online] Michigan Technological University, undated [retrieved on Jun. 21, 2005]. Retrieved from the Internet: <URL: http://www.mfg.mtu.edu/cyberman/quality/metrology/surface.html>.

Spring, S., *Metal Cleaning*, Reinhold Publishing Corporation, New York, pp. 85-89, (1963).

* cited by examiner

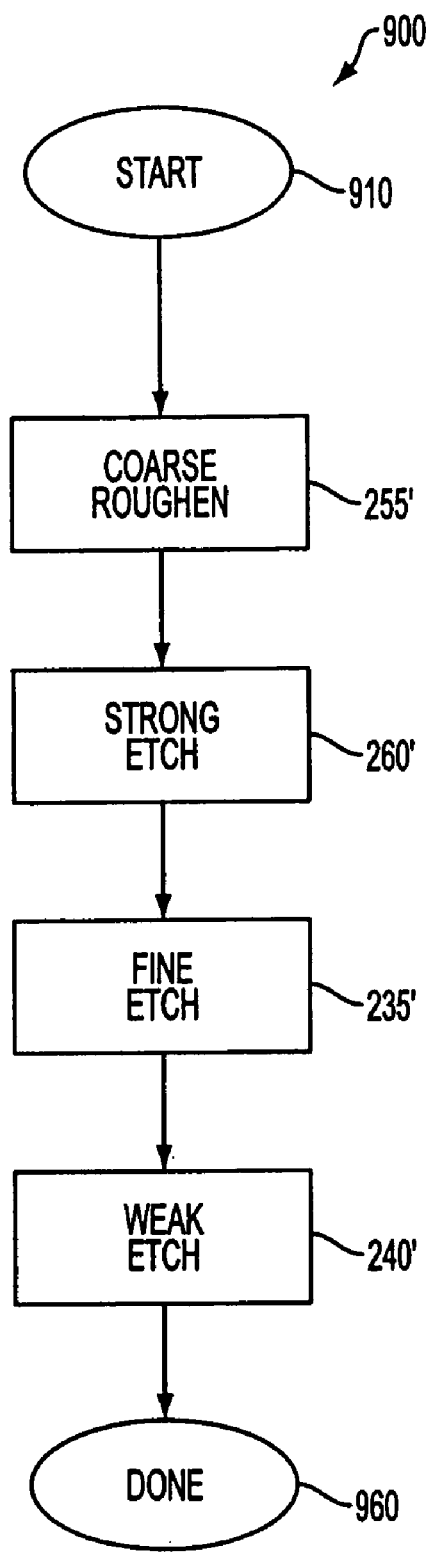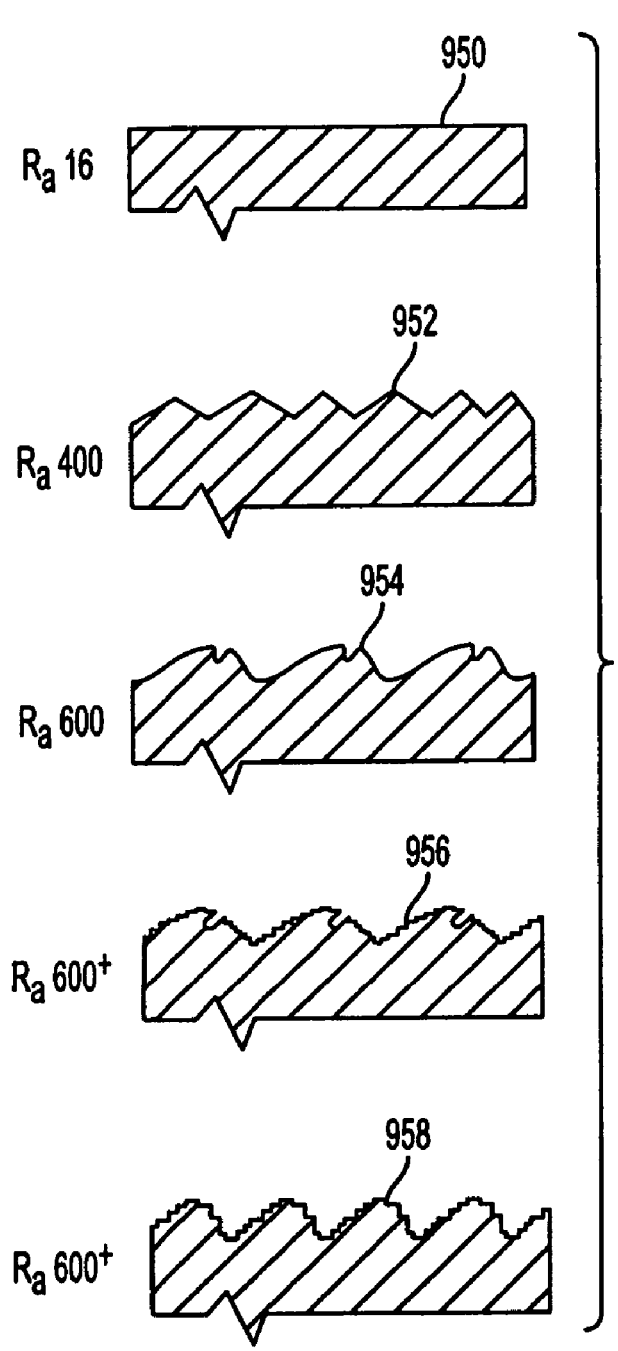
FIG. 9A
FIG. 9B

CLEANING PROCESS AND APPARATUS FOR SILICATE MATERIALS

CROSS-REFERENCE TO RELATED APPLICATIONS

This application is related to co-owned and copending U.S. patent application Ser. No.: 10/627,416 entitled "Ultrasonic Assisted Etch Using Corrosive Liquids", filed concurrently herewith, and incorporated herein by reference in its entirety.

BACKGROUND OF THE INVENTION

1. Field of the Invention

The present invention relates to methods and apparatus for treating silicate substrate surfaces and, more particularly, textured quartz substrates.

2. Description of the Related Art

During most semiconductor manufacturing processes, such as dielectric etching or chemical vapor deposition, unwanted materials are sometimes formed on the interior surfaces of the processing chamber and on the chamber parts used in the manufacturing process. It is important that the materials deposited on the interior surfaces and chamber parts not become a source of contaminants that can flake, fall, or be knocked off and deposit upon a wafer that is being processed in the chamber. Such contaminants can damage the wafer, reducing the "yield" of usable devices.

For example, in dielectric etching long-chain carbon polymers may build up on the interior walls of the processing chamber. Loose particles of these polymers may break off during the manufacturing process and contaminate the wafers. Contaminants can cause high resistance, adhesion problems for subsequent layers, reduced insulation, and other performance and reliability problems.

Conventionally, processing chambers and parts are cleaned by manual scrubbing. In this conventional method, the manufacturing process is halted and the processing chamber opened such that the interior walls may be scrubbed. Sometimes, when manual scrubbing is not thorough enough, the yield of semiconductors subsequently processed will be greatly affected. Furthermore, scrubbing does not tend to be completely thorough, especially with high-surface area textured surfaces.

Other methods have been proposed to overcome problems with the conventional manual scrubbing method. One such method, which is applicable to removing oxide and dielectric contaminant build-up, involves the use of a plasma-enhanced etching process to "dry clean" the semiconductor processing parts. In that prior art method, fluorine-based gases such as $CF_4$ and $CHF_3$ and oxygen are highly energized to form a plasma which reacts with the contaminants to form $CO_2$, $SiF_2$ and other gaseous compounds which are then vacuumed away through the processing chamber's exhaust system.

One of the more common silicates used for chamber parts and surfaces is quartz ($SiO_2$). For example, quartz domes are used to define the top portion of some semiconductor chambers, and quartz nozzles are used to inject gasses into semiconductor chambers. However, the prior art methodology is generally not well suited for cleaning processing chambers which include quartz substrates. Quartz parts and domes are frequently sent out to specialty cleaning houses or replaced, at considerable cost.

Quartz is usually manufactured with a smooth surface, e.g. having a roughness of about 16 Ra. However, contaminants which may be deposited on quartz of such smoothness during the semiconductor manufacturing process do not adhere well to the quartz surface, and are prone to becoming separated from the quartz surface and settling on the semiconductor wafer being processed. For this reason, quartz is often "textured" by increasing its surface area by, for example, roughening, to increase the adhesion or "stiction" of the contaminant layer on the quartz.

FIGS. 1A–1D illustrate a prior art roughening process 100 where a coarse grit 110 is projected at an angle 140 that is from 60–90° to the surface 120 of a substrate 130. If the angle is less steep than about 60°, the texturing process is considered to be too slow for most purposes. However, it has been found that grit-blasting at the high angles tends to create cracks 150 in the roughened surface. These cracks can cause pieces of the roughened surface to become a source of particle contaminants 160 by becoming dislodged from substrate 130, suca as illustrated in FIG. 1C. Such particle contaminants may introduce impurities in the wafers being processed, adversely affect yield. In addition, as illustrated in FIG. 1D, contaminants may adhere to the substrate surface over time and will eventually flake off or otherwise become dislodged from substrate 130 and fall in pieces 170 onto the wafers.

Therefore, what is needed is a method of forming a textured quartz substrate surface generates fewer cracks and other defects, and which reduces flaking or shedding of particulate matter, such as dust and other contaminants that have accumulated on the surface, while maintaining a high surface area. In addition, the shape and roughness of the surface should provide improved adhesive properties for holding on to such particulate matter during the course of semiconductor processing. Also needed are systems capable of forming such a substrate surface and a method and apparatus which is particularly applicable to remove polymer and photoresistive contaminant build-up on these surfaces such as quartz. It is further desirable to further increase the surface area of a textured quartz surface.

SUMMARY OF THE INVENTION

The present invention provides methods and apparatus for treating silicon-containing materials and, in particular, textured quartz. The present invention provides a high surface area (as preferably measured by roughness), which increases the stiction of contaminant layers to the textured quartz working surface. Furthermore, the present invention reduces cracks, fractures and other defects in the textured quartz surface, thereby reducing contaminant particles that may flake off or otherwise be dislodged from the quartz surface.

In one aspect of the present invention, a method for treating a surface of a quartz substrate includes preparing a quartz substrate to provide a working surface having an initial working surface roughness; and then ultrasonically acid-etching the working surface to increase the roughness of the working surface by at least about 10%. In one embodiment, the initial surface roughness is greater than about 10 Ra, and in another embodiment the initial surface roughness is greater than about 200 Ra. In a still further embodiment, the initial surface area, if less than about 200 Ra, is increased to greater than about 200 Ra. In other embodiments of the present invention, the working surface roughness is increased by at least about 25% or at least about 50%.

In another embodiment, the working surface is grit blasting after ultrasonically acid-etching the working surface with a fine grit having a mesh size greater than about 100.

In another embodiment, the fine grit has a mesh size of greater than about 200. In a still further embodiment, a second acid-etching is performed after the fine grit blasting.

In another aspect of the present invention, a method for treating a surface of a quartz substrate includes ultrasonically acid-etching a substrate to substantially remove one or more cracks in a working surface of the substrate; and subjecting the substrate surface to a final cleaning process which prepares the substrate for use. In one embodiment, the method includes coarse grit blasting the working surface prior to ultrasonically acid-etching to produce a roughened surface having an average surface roughness (Ra) of between about 100 and about 400 Ra.

In another embodiment, the final cleaning process includes contacting the substrate with an acidic solution selected from the group consisting of $HF:HNO_3:H_2O$ and $HF:H_2O_2:HNO_3$, rinsing the substrate with deionized water; ultrasonicating the substrate in an ultrasonication deionized water bath; drying the substrate with nitrogen to remove excess moisture; and heating the substrate under a heat lamp or in an oven to thoroughly dry the substrate.

In another embodiment, the method includes micro-roughening the surface of the substrate prior to the final cleaning process by: (a) positioning a pressurized grit expulsion nozzle a predetermined distance from, and at an angle less than about 60° to, the substrate surface; and (b) ejecting grit from the nozzle against the surface at a velocity sufficient to produce a micro-roughened surface.

In another aspect of the present invention, a method for treating a surface of a silicon-containing substrate includes immersing the substrate into a chemical solution to substantially remove a non-organic contaminant; rinsing the substrate with deionized water; and subjecting the substrate surface to a final cleaning process which prepares the substrate for use. In one embodiment the method further includes immersing the substrate into a second chemical solution to substantially remove an organic contaminant before immersing the substrate into the first chemical solution. In another embodiment the method further includes heating the substrate in a furnace at a high temperature to damage chemical bonds after immersing the substrate into the second chemical solution but before immersing the substrate in the first chemical solution.

In another aspect, the present invention includes an apparatus for roughening a surface of a substrate including a base adapted to support the substrate during a roughening operation; a pressurized grit expulsion nozzle having a nozzle adapted to project grit against the surface of the substrate at a predetermined distance from, and at an angle less than about 60° to, the surface of the substrate; and a drive mechanism for rotating one or more of the base and the grit source to provide relative motion between the nozzle and the base during the roughening operation.

It will therefore be appreciated that the methods and apparatus of the present invention provide for the treatment of silicon-containing substrates and, in one preferred embodiment, textured quartz surfaces. These and other advantages and features of the invention will be more fully appreciated when the following detailed description of the invention is read in conjunction with the accompanying drawings.

BRIEF DESCRIPTION OF THE FIGURES

FIG. 9A is a flow chart illustrating a method for treating a quartz surface in accordance with certain embodiments of the invention; and FIG. 9B illustrates the quartz surface at various stages during the method of FIG. 9A.

DETAILED DESCRIPTION OF THE PREFERRED EMBODIMENTS

Figure 1A:
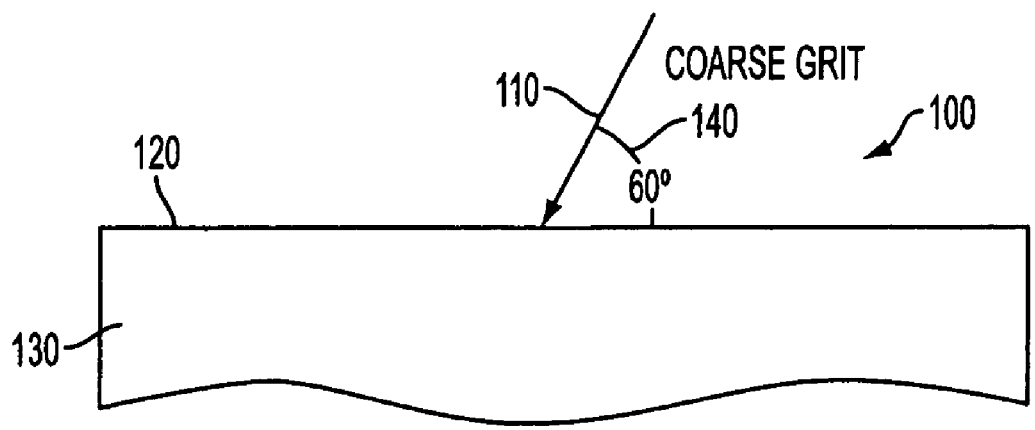
FIGS. 1A–1D are illustrations of a surfaces prepared in accordance with prior art methods.
Figure 1B:
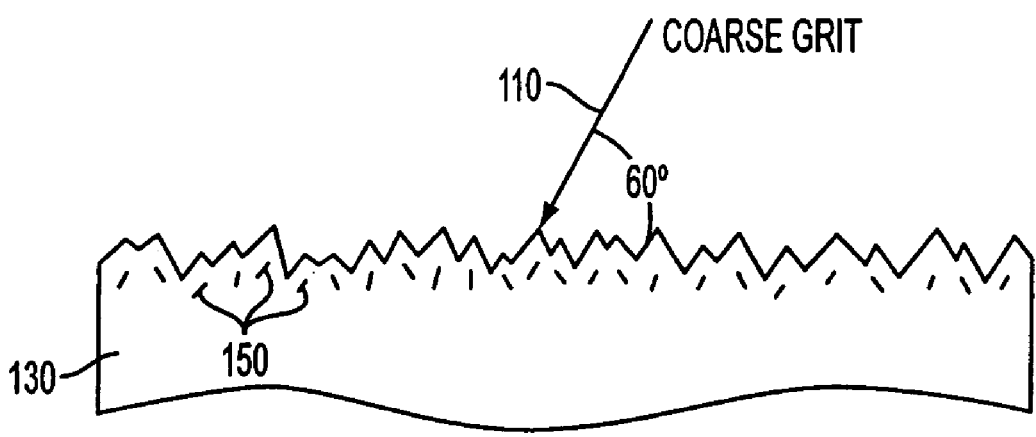
Figure 1C:
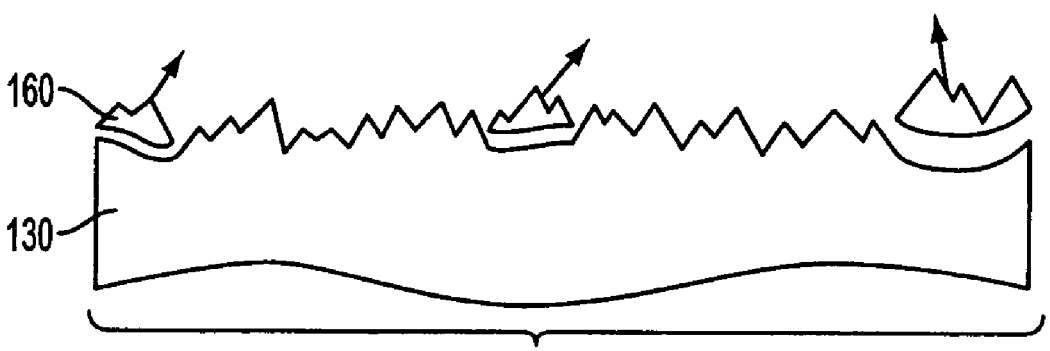
Figure 1D:
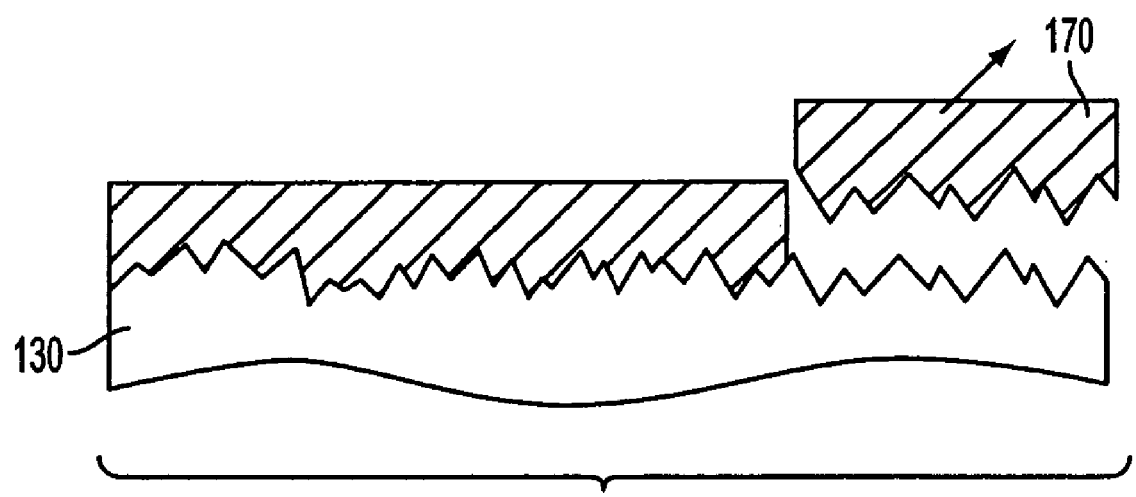

Unless otherwise indicated, all technical and scientific terms used herein have the same meaning as they would to one skilled in the art of the present invention. It is to be understood that this invention is not limited to the particular methodology, protocols and reagents described, as these may vary. All publications and patents cited herein are expressly incorporated herein by reference for the purpose of describing and disclosing methodologies and devices with might be used in connection with the cleaning and micro-roughing processes and devices of the invention.

I. Definitions

By "micro-roughening" or "micro-roughness" is meant the root mean square of the short-range deviations of a surface above and below its mean position, and includes the way in which the micro-roughness is distributed at different spatial frequencies, or different sizes, of structure on the surface of interest. This is to be distinguished from isolated surface defects and contaminants such as dust particles.

It is understood that the term "substrate" as used herein includes, but is not limited to a part which is undergoing a cleaning or micro-roughening operation, a semiconductor material in the form of a film on a substrate, homogeneous wafer, or a multi-layered wafer.

The term "semiconductor material" as used herein includes, but is not limited to single crystal silicon, polysilicon, amorphous silicon and III-V semiconductor material.

The term "substrate surface" includes the semiconductor device substrate as well as all layers fabricated on the semiconductor device substrate. Therefore, substrate surface refers to the present uppermost surface of the substrate, including all structures formed thereon.

The term "pressurized" is used herein to refer to pressures above atmospheric pressure.

As used herein, "grit" refers to any abrasive particle, such as super hard crystalline or polycrystalline substance, or mixture of substances and includes but is not limited to diamond, polycrystalline diamond, cubic boron nitride, and polycrystalline cubic boron nitride.

As used herein, the term "etching" refers to the selective removal of material. This includes, but is not limited to, cleaning, polishing and texturing.

As used herein, the term "ultrasonic" generally refers to acoustic disturbances in a frequency range above about eighteen kilohertz and which extend upwards to over two megahertz.

The invention is further illustrated by the following preferred embodiments. In the drawings, like numbers refer to like features, and the same number appearing in more than one drawing refers to the same feature.

II. Method and Apparatus of the Invention

The invention provides, in one aspect, methods for cleaning, micro-roughening or otherwise treating a surface of a substrate. It has been discovered that the methods, as described in detail below, are capable of forming a micro-roughened substrate surface having a number of advantages over the prior art. The substrate has fewer cracks below the surface, which reduces flaking or shedding of particulate matter, such as dust and other contaminants, that have accumulated on the surface. Furthermore, the shape and roughness of the surface provide improved adhesive properties for collecting such particulate matter during the course of semiconductor processing. Still further, the surface area is increased, which increases the stiction of contaminant layers to the substrate.

The method has been shown to be particularly effective in cleaning contaminants from high purity quartz, which is commonly found in rods, tubes, crucibles, domes, chambers and bell jars. The method is also useful for cleaning contaminants from other semiconductor workpieces such as those including polysilicon and single crystal silicon, which can be found in chamber roofs, source rings, collars and wafers. Considered below are the steps of the method and apparatus useful for carrying out the method.

Figure 2:
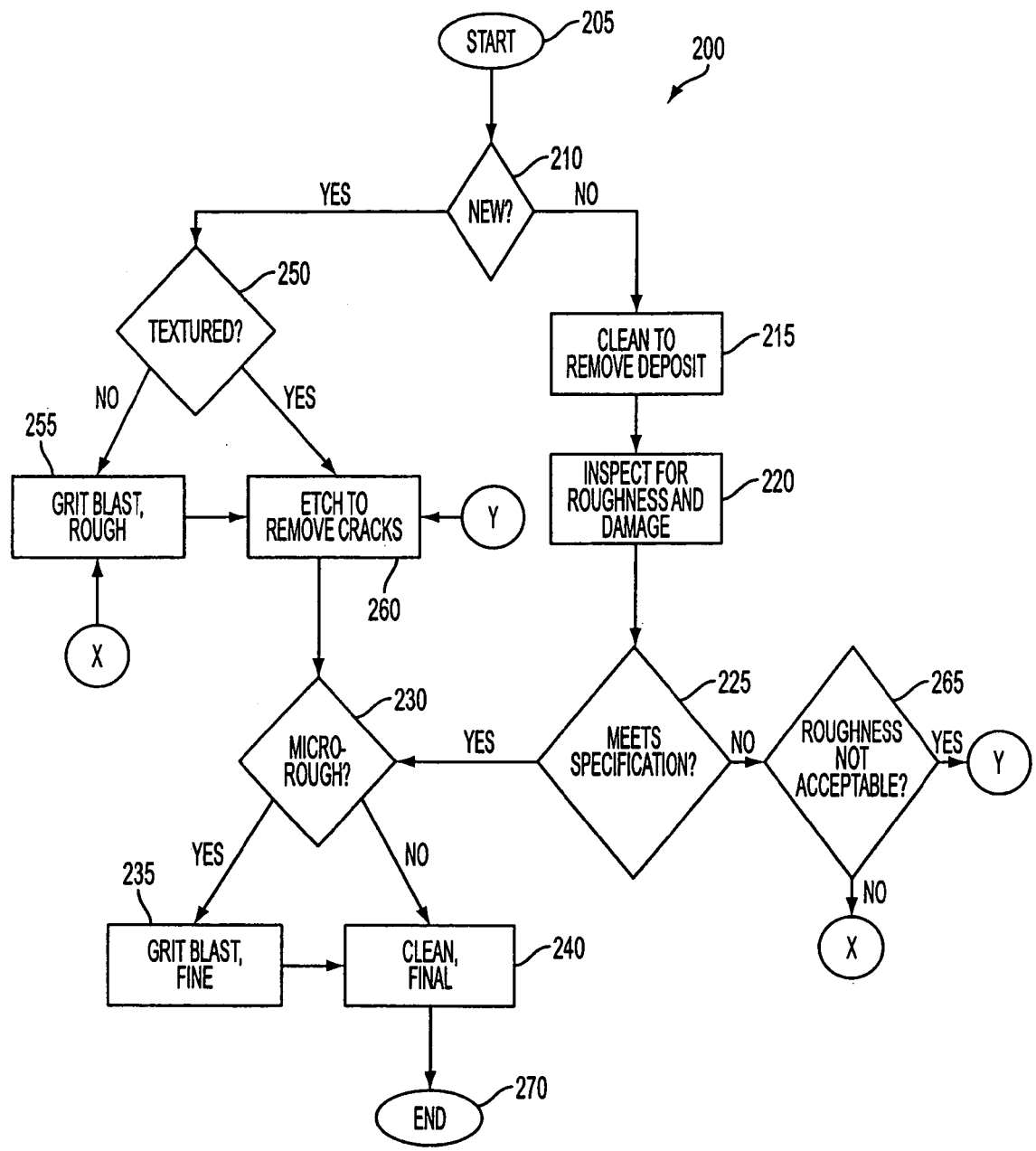
FIG. 2 is a flowchart illustrating a process for cleaning a surface of a substrate in accordance with the present invention.

FIG. 2 is a flowchart illustrating a general method 200 for cleaning substrates, e.g., high purity quartz, in accordance with one embodiment of the invention. Preferred substrates include semiconductor fabrication equipment parts such as those noted above. Method 200 starts at operation 205 and proceeds to operation 210 where a decision is made as to whether the substrate is new or not. If the substrate is not new, then the method proceeds to operation 215 to clean the substrate to remove any deposits. One such cleaning method is described in greater detail herein with reference to FIG. 7.

Various methods may be used to clean deposits from semiconductor manufacturing substrates. Several preferred methods for cleaning substrates using organic solvents is described in co-owned U.S. patent application Ser. No. 09/945,259, filed Aug. 21, 2001, which is incorporated by reference herein in its entirety. Another method for cleaning semiconductor fabrication substrates is disclosed in co-owned U.S. patent application Ser. No. 09/927,263, filed Aug. 10, 2001 which is incorporated by reference herein in its entirety.

From operation 215 of FIG. 2, the method then proceeds to operation 220 to inspect the substrate surface for roughness and/or damage. The inspection operation is described in greater detail herein with reference to FIG. 8.

Next, in operation 225, a decision is made as to whether the substrate surface meets the required parameters for roughness. If, in operation 225 of method 200, a decision is made that the substrate does not meet the specification, then the method proceeds to decision 265 where a decision is made as to whether the substrate surface roughness is acceptable. If the roughness is not acceptable, then method 200 proceeds to operation 255 where the substrate surface is grit blasted rough as described herein. If the substrate surface is determined to be acceptable in operation 265, then method 200 proceeds to operation 260 where the substrate surface is etched to remove cracks.

If the substrate meets the required specification for roughness, then a decision 230 is made as to whether the surface needs to be micro-roughened. If the surface needs to be micro-roughened, then the method 200 proceeds to operation 235 where the substrate surface undergoes a micro-roughening process. The micro-roughening process is described in greater detail with reference to FIGS. 3A–3D herein.

If the surface does not need to be micro-roughened, then the method 200 proceeds to operation 240 where the substrate surface undergoes a final clean operation 240. The final clean operation is described in greater detail herein with reference to FIG. 6. Following the final clean operation, method 200 then terminates at operation 270.

With reference to operation 210 in FIG. 2, if the substrate surface is determined to be new in operation 210 then a decision 250 is made as to whether the substrate surface is textured. If the substrate surface is not textured, then the surface may be grit blasted rough in operation 255 to create a textured surface.

Rough grit blasting may be performed by a variety of methods known to those of skill in the art. The method of micro-roughening described herein with reference to FIGS. 3A–3D, as well as the apparatus, may be used with, e.g. larger grit sizes and/or various angle changes as needed, such that the substrate surface is roughened to a level to properly texture the substrate surface.

If, in operation 250 of FIG. 2, a decision is made that the substrate surface is properly textured or if the substrate surface is grit blasted rough in operation 255, then method 200 proceeds to operation 260 where the substrate is etched to remove any cracks that may be present below the surface of the substrate. The etching operation 260 is described in greater detail with reference to FIG. 4 herein.

In FIG. 2, following etching operation 260, method 200 then proceeds to operation 230 where a decision is made as to whether the surface needs to be micro-roughened as described herein.

During a semiconductor fabrication process, materials are not only deposited on the wafer, but also are deposited on substrates that are part of the semiconductor fabrication equipment. For certain materials, if the surfaces of these substrates are not sufficiently rough, the material may not adhere to the fabrication parts and might flake off the parts onto the wafer, thus contaminating the wafer. Presently, in most cases, the manufacturers of these fabrication parts do not provide a sufficient degree of roughness on the fabrication parts. This is primarily due to the fact that present roughening processes either damage the substrate parts or make the surfaces too smooth, either of which can have detrimental effects on the overall manufacturing process.

If the substrate surface is roughened too extensively, the thinner fabrication components may be penetrated by the blasting material. On the other hand, if the shield is blasted for long periods of time, the cleaning process may produce a relatively smooth surface, which readily allows materials to flake off onto the wafer. Alternatively, or in addition to these hazards, cracks may form below the surface of these extensively roughed substrates, particularly quartz, causing large pieces of the substrate to fall off during semiconductor manufacturing. The method discussed with reference to FIGS. 3A–3D herein remedies the foregoing problems.

FIGS. 3A–3D illustrate an embodiment of a substrate 305 having a surface 310 that undergoes the micro-roughing process 200, noted in operations 230 and 235 of FIG. 2, in accordance with the principles of the present invention. The substrate surface micro-roughening process includes a conventional pressurized grit source 315 with a nozzle 320, from which a plurality of grit (generally designated 325) is sprayed onto a substrate surface 310 of a section of substrate 305. For illustrative purposes only, the substrate 305 is shown to have a concave surface, however, it should be understood that the substrate surface may have any number of shapes, e.g. flat, circular, etc. A base (not shown) may be provided and adapted to support the substrate during the roughening operation.

In one embodiment, the substrate 305 is made of a high purity quartz material. The pressurized grit source 315, such as a vacuum-type bead blast tool, is positioned at a distance of approximately three to nine inches, preferably six inches, from the substrate surface 310, at an angle less than about 60°, preferably approximately 45°+/−5°, and more preferably 45°. If the pressurized grit source 315 is positioned at angles that deviate substantially from the above-specified range of angles, the resultant substrate surface 310 from the roughening process may not have the superior properties mentioned above. This directional-dependent micro-roughness has the desired effect of facilitating the adhesion of the contaminant atoms or molecules, e.g., metals, which are traveling toward the substrate surface 310, when the substrate 305 is employed in the semiconductor manufacturing process.

The grit angle is preferably held constant by a grit source mobilization unit 380. Alternatively, mobilization unit 380, includes means for adjusting the grit source nozzle 320 such that the angle of grit ejection may be altered before or during the micro-roughening operation.

Figure 3A:
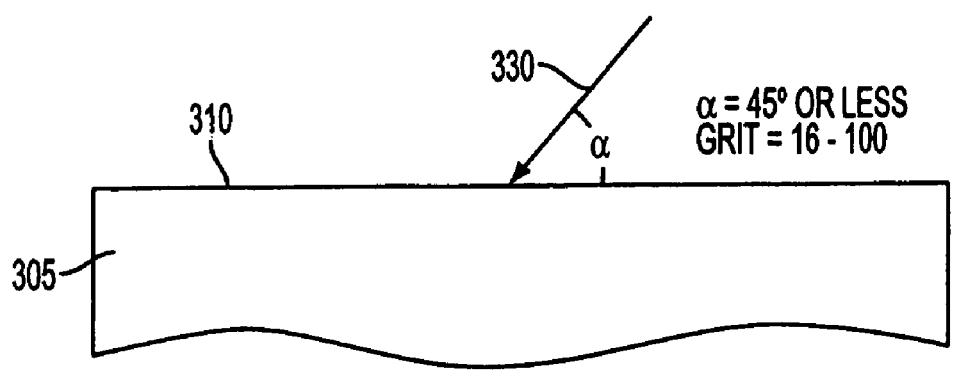
FIGS. 3A–3D are illustrations of an apparatus and substrate for treating a surface of the substrate in accordance with the present invention.
Figure 3B:
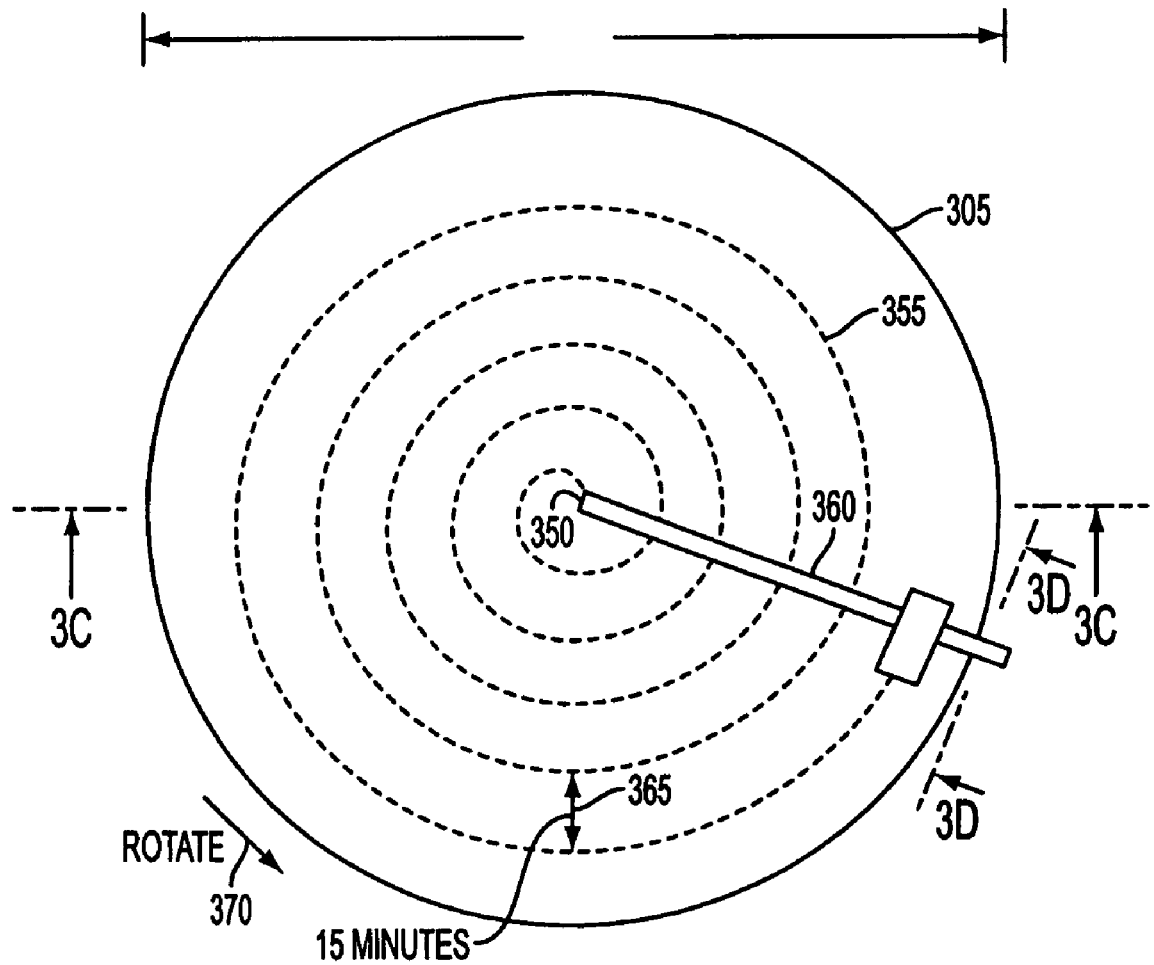
Figure 3C:
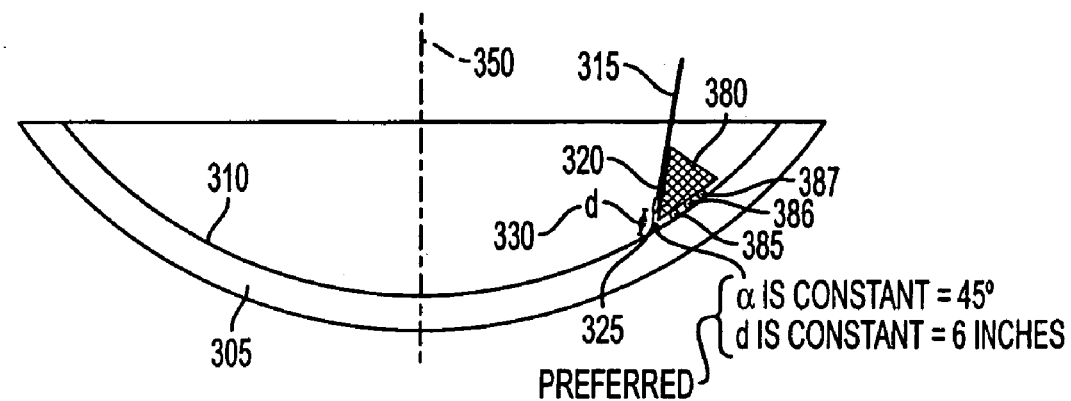
Figure 3D:
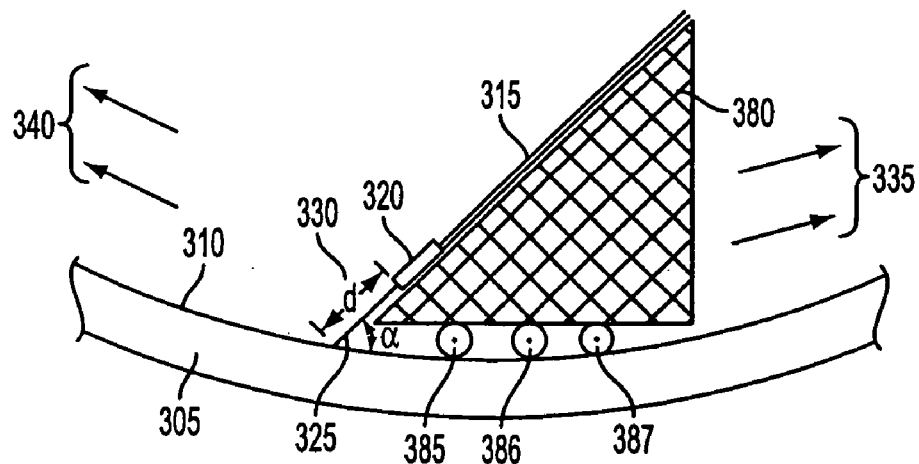

In one embodiment, the pressurized grit source 315, when projecting the plurality of grit 325 onto the substrate surface 310, is translated across the substrate surface 310 by the mobilization unit 380, e.g. on wheels 385, 386, 387, in the directions depicted by a plurality of direction arrows 335, 340 illustrated in FIG. 3D, analogous to a sweeping motion. Alternatively, the pressurized grit source is translated in a single direction 370 as shown in FIG. 3B. Preferably, the pressurized grit source and/or the substrate surface are rotated relative to one another.

Alternatively, or in addition to, the relative rotation noted above, the pressurized grit source may be moved toward the axis of rotation 350 of the substrate, e.g., on a radial arm 360. When combined with the relative rotational velocity, the translational motion between the pressurized grit source and the substrate surface define a spiral locus 355 centered at the axis of rotation 350 of the substrate or arm 360.

The ejected grit forms a grit impact area (not shown). The relative rotational and translational velocity just described can define the grit impact area such that the grit impact area can be adjusted or controlled by adjustment of these velocities. In one embodiment of the invention, the grit impact area spans a distance in a direction extending radially from the center of the substrate. In this embodiment, the micro-roughening method includes rotating one or more of the surface 310 and the pressurized grit source 315 relative to one another and, at substantially the same time, moving the pressurized grit source toward the axis of rotation of the substrate which provides the relative rotational and translational motion between the pressurized grit source 315 and the substrate surface 310 such that a spiral locus 355 is defined as noted above.

In one embodiment of the invention, providing the relative motion includes moving the pressurized grit source radially at a rate such that the pressurized grit source is moved by a distance equal to the distance spanned by the grit impact area for each complete rotation 365 of the pressurized grit source and/or substrate about the center of the axis of rotation 350. In this embodiment, the grit impact area completely and uniformly covers the surface of the substrate when the spiral locus is defined. This may be repeated to achieve a desired micro-roughened surface.

Alternatively, providing the relative motion includes moving the pressurized grit source radially at a rate such that the pressurized grit source is moved radially by a distance which is less than the distance spanned by the grit impact area for each complete rotation 365 of the pressurized grit source about the center of the axis of rotation 350.

The plurality of grit 325 used in the roughening process may be formed of any suitable abrasive material such as aluminum oxide, silicon carbide and/or tungsten carbide as described in U.S. Pat. No. 5,170,245, which is incorporated herein by reference. The grit size is typically between 16 and 100 and in an advantageous embodiment of the process, a grit size intermediate to 16 and 100 is used. The grit 330 is projected onto the substrate surface 310 at a velocity sufficient to roughen the substrate surface 310. The relationship between the blast time and the surface roughness obtained is dependent upon the type of substrate used and may be determined by one of skill in the art.

It should be understood that the size of the impact area of the grit will vary depending on operation parameters. For instance the opening in the nozzle 320 may vary the size of the impact area or the speed at which the motion is conducted may also vary the size of the impact area, or changing the pressure.

From the above, it is apparent that the present invention provides a method of treating a surface of a substrate by a roughening process. The method includes the steps of positioning a pressurized grit source a predetermined distance from and at a desired angle substantially to the surface of the object that is to be roughened and projecting grit from the pressurized grit source against the substrate surface at a velocity sufficient to form a roughened surface. A roughened surface increases surface area, and therefore stiction of contaminant layers to workings surfaces of substrates.

Figure 4:
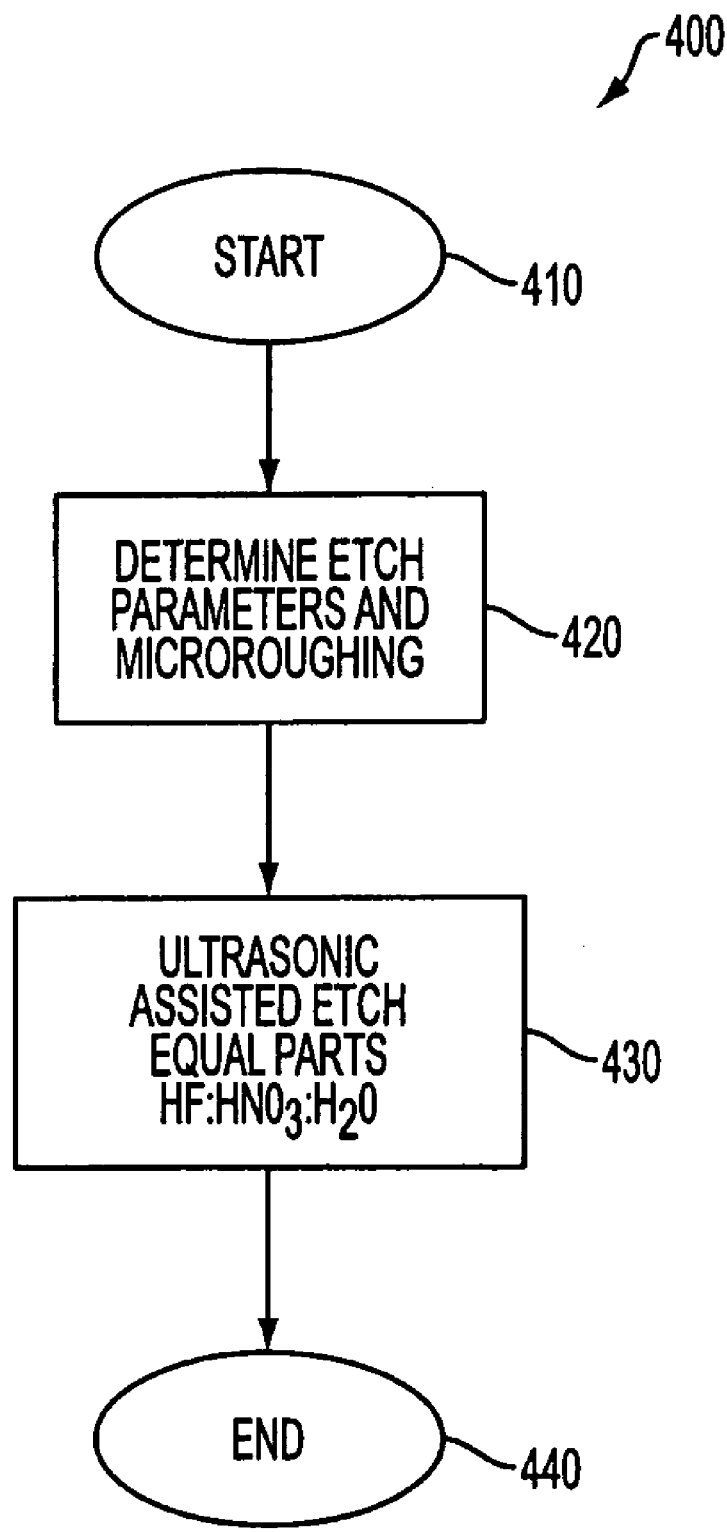
FIG. 4 is a flowchart illustrating a process of etching a substrate according to one embodiment of the invention.

FIG. 4 illustrates an etching process 400 according to one embodiment of the invention. Etching process 400 begins at operation 410 and proceeds to operation 420 where the etch and micro-roughing parameters are determined. Operation 420 is described in greater detail herein with reference to FIG. 5.

Next, etching process 400 then proceeds to operation 430 where the substrate surface undergoes an acid-assisted etch as described in co-owned U.S. application number copending U.S. patent application Ser. No. 10/627,416 entitled "Ultrasonic Assisted Etch Using Corrosive Liquids", which has been incorporated herein by reference. Following the acid-assisted etch operation 430, method 400 then terminates at operation 440.

Figure 5:
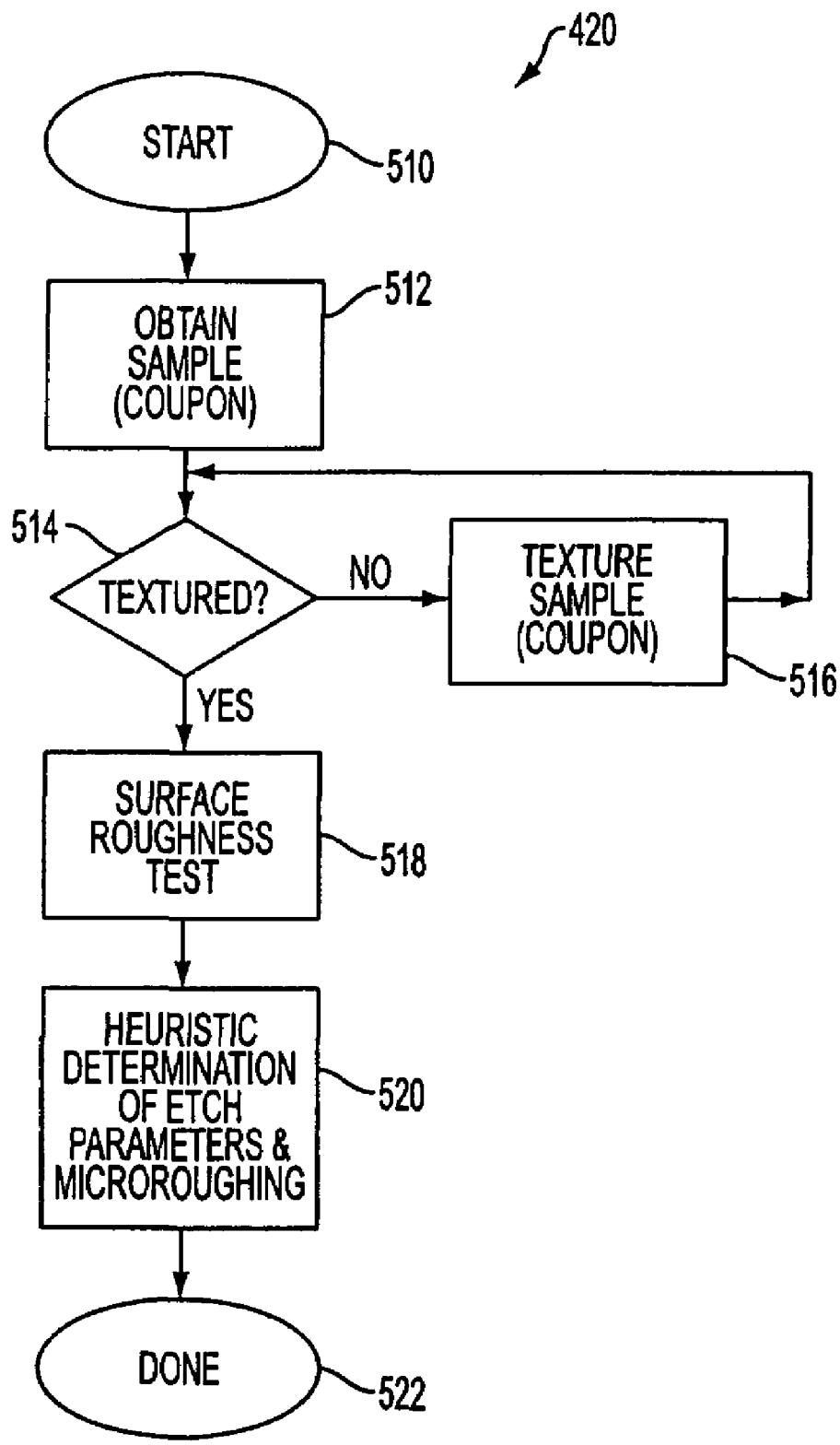
FIG. 5 is a flowchart illustrating a process for determining the etch and micro-roughening parameters according to one embodiment of the invention.

FIG. 5 is a flowchart illustrating a process for determining the etch and micro-roughening parameters according to one embodiment. In FIG. 5, method 420 begins at 510 and proceeds to operation 512 for obtaining a sample ("coupon"). Next a decision is made at operation 514 to determine whether the sample is textured. If it is decided that the sample is not textured, then the method proceeds to operation 516 to texture the sample. However, if it is decided that the sample is textured, then the method proceeds to operation 518 where a surface roughness test is performed. Next, the method proceeds to operation 520 for making a heuristic determination of etch parameters and micro-roughening parameters. For example, such a heuristic determination may involve a table look-up based on surface roughness. The method 420 terminates at operation 522.

Figure 6:
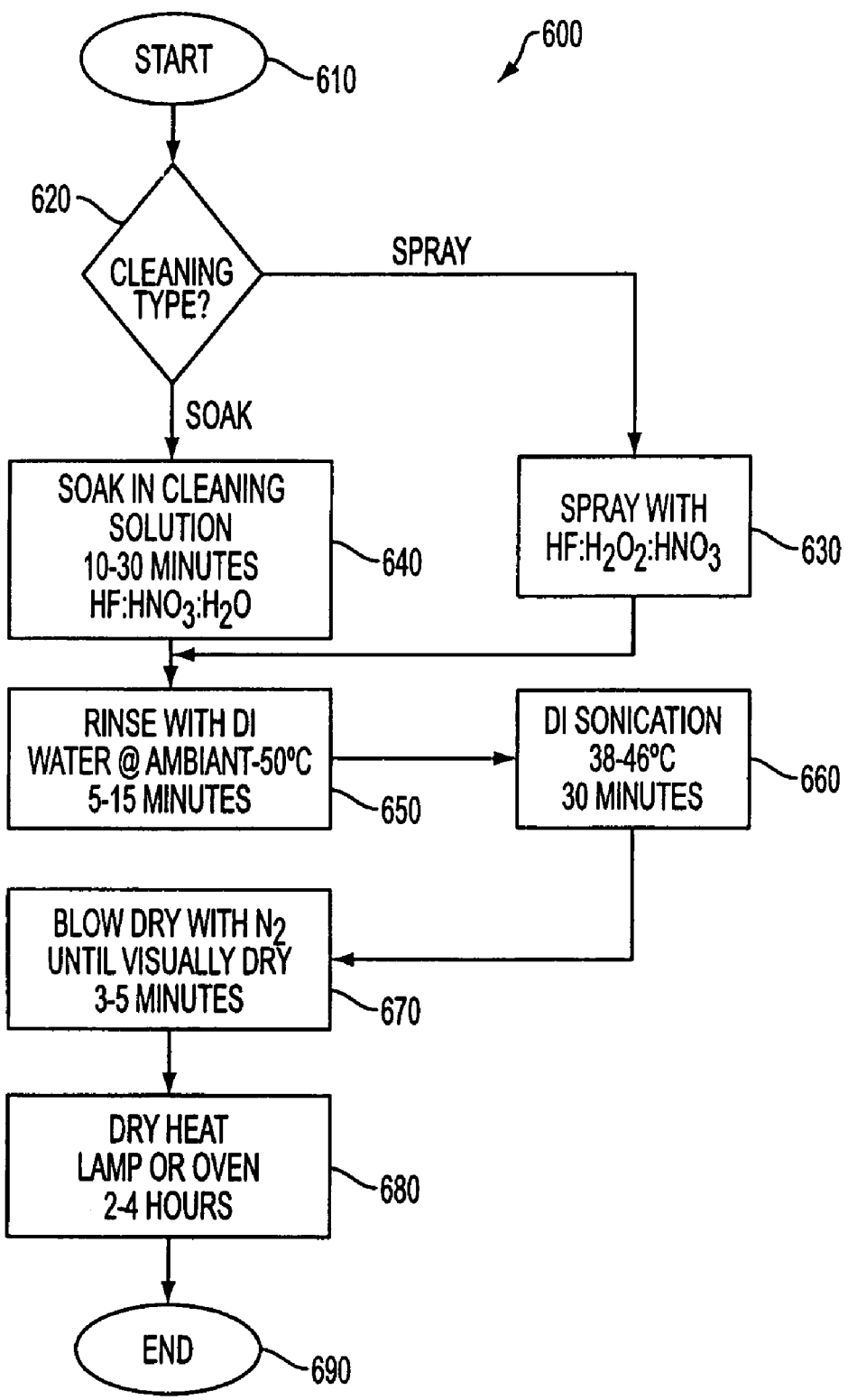
FIG. 6 is a flowchart illustrating one embodiment of the cleaning process in accordance with the invention.

FIG. 6 illustrates the final clean process 600. In FIG. 6, the operation begins at 610 and proceeds to decision operation 620 where the cleaning type is determined. From operation 620, the substrate surface is either sprayed with an acidic solution, such as $HF:H_2O_2:HNO_3$, in operation 630 or soaked in a cleaning solution, such as $HF:HNO_3:H_2O$, for 10–30 minutes as shown in operation 640.

Final cleaning method 600 then proceeds to operation 650 where the substrate surface is rinsed with deionized water at 20° C.–50° C. for 5–15 minutes. Operation 650 is then followed by operation 660 where the substrate surface is sonicated in deionized water for approximately 30 minutes at 38–46° C. The substrate surface is then blow dried with $N_2$ until visually dry for approximately 3–5 minutes in operation 670. The cleaning method 600 then proceeds to operation 680 where the substrate surface is dried under a heat lamp or in an oven for 2–4 hours. Final cleaning method 600 then terminates at operation 690.

Figure 7:
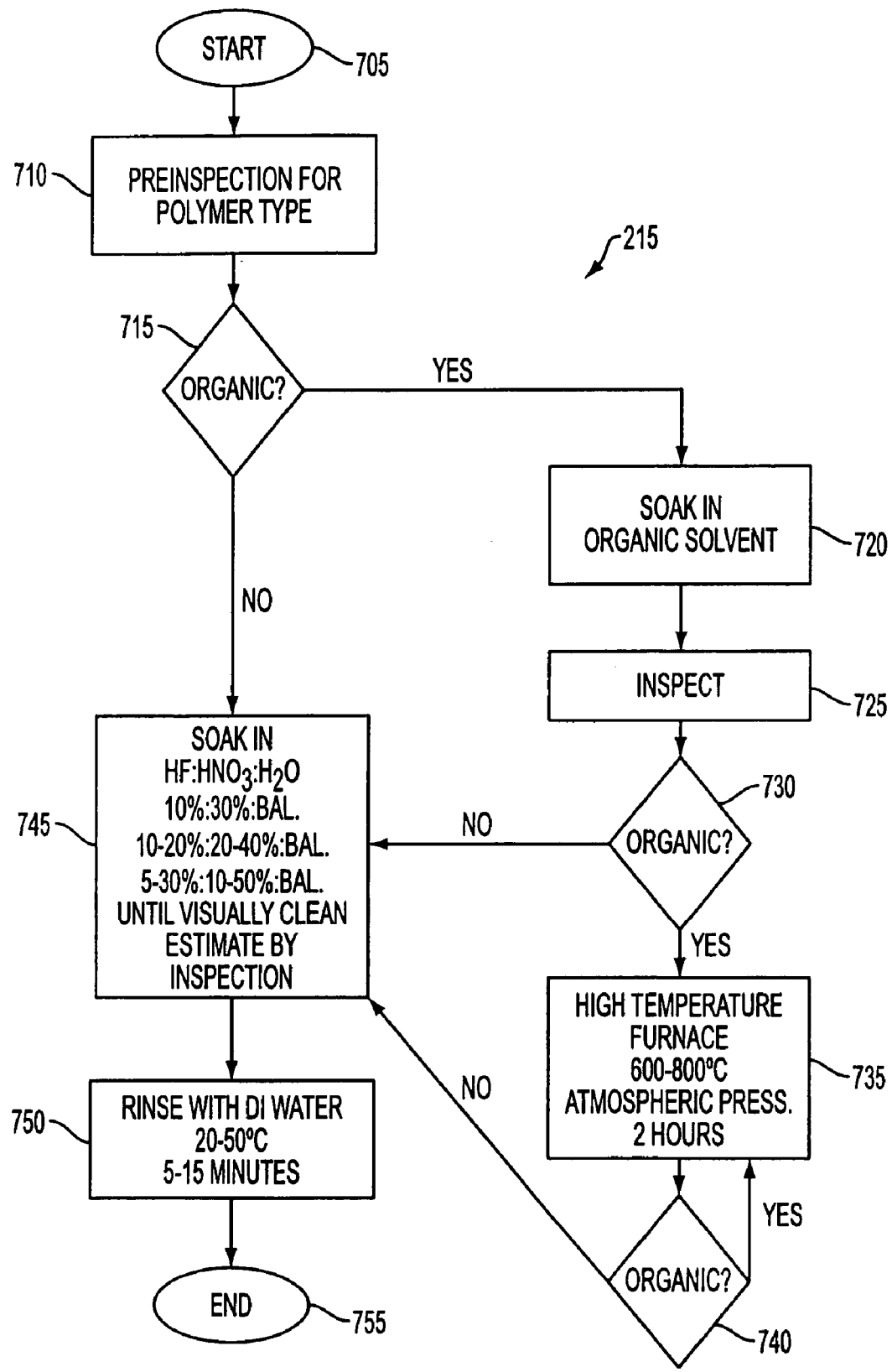
FIG. 7 is a flowchart illustrating a cleaning process in accordance with another embodiment of the invention.

FIG. 7 describes a general cleaning process 700, which corresponds to operation 215 of FIG. 2, according to one embodiment of the invention, whereby a polymer deposited on semiconductor equipment substrate surfaces during wafer processing can be removed. The process 700 starts at operation 705 and proceeds to operation 710 where a pre-inspection step is performed to determine the type of polymer deposited on the substrate surface. The pre-inspection operation may include preparing and testing the substrate surface and other pre-inspection operations that will be apparent to those of skill in the art. When characterizing the part with respect to organics, surface extractions may be made using deionized water and solvents that are then analyzed by a total organic carbon analyzer (TOC) and Gas Chromatography (GC) or Gas Chromatography with Mass Spectrometry (GCMS). Alternatively, or additionally, the entire substrate may be outgassed at a high temperature with the resulting gasses being analyzed by dynamic head space GCMS or ATD GCMS.

A decision 715 is then made depending on the type of polymer determined in operation 710. If the deposited polymer type is organic, then method 700 proceeds to operation 720 where the substrate is soaked, wetted, dipped, and/or vapor contacted in an organic solvent. A number of organic solvents may be used in the softening, dissolution and removal of the organic process polymers from the substrate surface. Three types of organic solvents that are particularly preferred include pyrrole-based solvents such as n-methyl pyrrolidinone (NMP), alpha-pyrrolidinone, beta-pyrrolidinone, pyrrolidine and pyrrole; amine-based solvents such as hydroxylamine, thylamine, methylamine, diethylamine and triethylamine; and fluoro/ether-based solvents such as ethyl perfluoroisobutyl ether, ethyl perfluorobutyl ether, nonafluorobutyl methyl ether, nonafluoroisobutyl methyl ether and decafluoropentane.

In some embodiments of the invention, the organic solvent is heated, e.g. to about 23° C. to about 60° C., to improve the softening and dissolution rate of the organic process polymer.

Following soaking of the substrate in the organic solvent, method 700 then proceeds to operation 725 where the substrate surface is inspected for the presence of any remaining organic polymers. If an unacceptable amount of one or more organic polymers remain on the surface as determined in operation 730, method 700 then proceeds to operation 735 where the substrate is subjected to a high temperature furnace, e.g. at a temperature ranging from about 600° C. to about 800° C. under atmospheric pressure for approximately 2 hours to break down the organic polymers. Operation 735 is repeated until an acceptable level of organic polymers are released from the surface as determined in operation 740.

If, at any of decision operations 715, 730 and/or 740, the substrate surface is found to be essentially free of organic polymer residue(s), method 700 proceeds to operation 745 whereby the substrate is soaked in an acidic solution until the substrate surface is deemed to be clean by inspection, e.g., visual inspection. The acidic solution used for the acid-soak typically contains hydrofluoric and/or nitric acid. Hydrofluoric acid is capable of breaking silicon and aluminum bonds by dissolving the silicon and aluminum oxides on the surface of the substrate. This frees any associated metal impurities, allowing them to be rinsed off of the surface. Nitric acid may be used to stabilize and increase the solubility of some metal impurities such that insoluble fluorides of calcium and magnesium are retained in the solution and away from the surface of the substrate. Preferred concentrations of $HF:HNO_3:H_2O$ include, 10%:30%: 60%, 10–20%:20–40%:to 100%, and 5–30%:10–50%: to 100%.

After the substrate surface has been soaked in the acidic solution until clean, method 700 proceeds to operation 750 where the substrate surface is rinsed with deionized water at about 20° C. to about 50° C. for 5–15 minutes. Following the deionized water rinse, method 700 terminates at operation 755.

Figure 8:
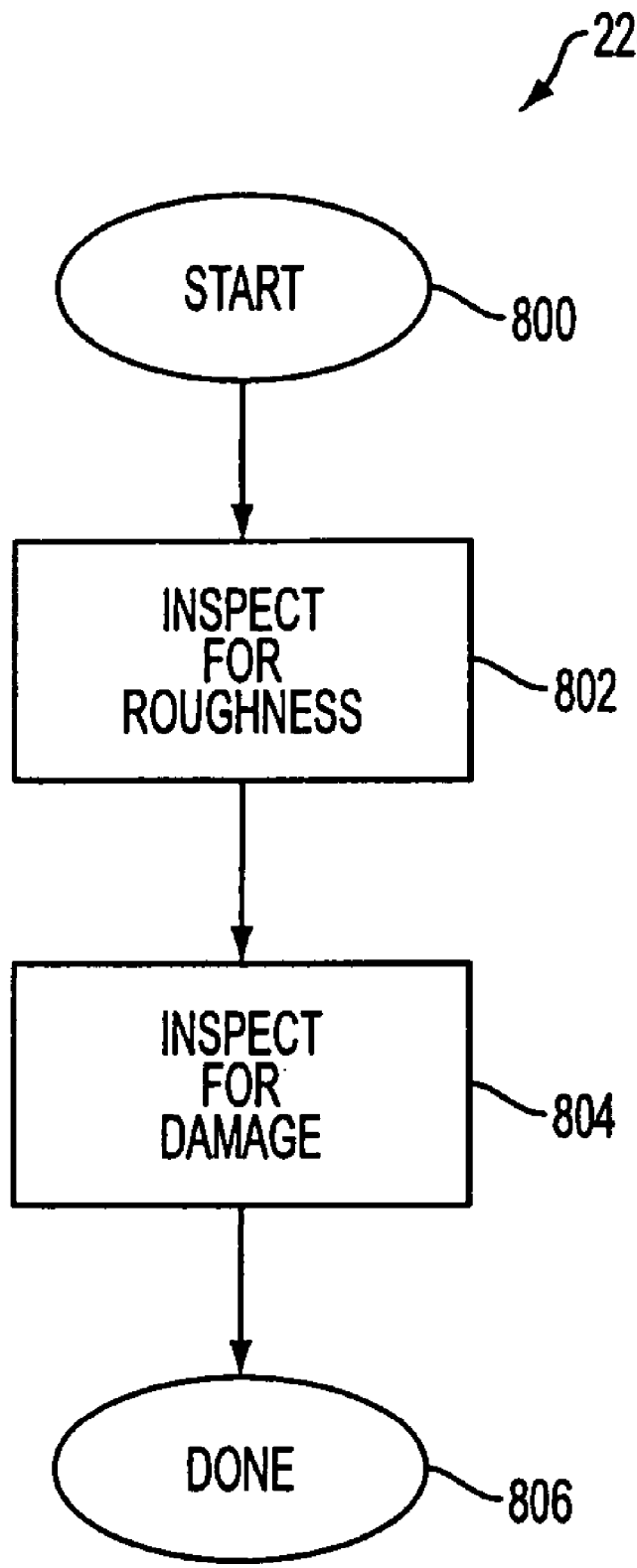
FIG. 8 is a flowchart illustrating a method for inspecting a substrate surface for roughness and/or damage.

In FIG. 8, the process 220 begins at 800, and in an operation 802 the surface is inspected for roughness. This is typically accomplished with a surface roughness (Ra) gauge known as a profilometer, which can be purchased from a variety of vendors, such as Mitotoyo of Japan or Federal Corporation or Taylor Hobson of the U.S.

The process then continues in an operation 804, which is preferably performed with a scanning electron microscope (SEM) at a magnification of, about, 2000. Cracks and other defects can be clearly seen in SEM photographs at this magnification. The process 220 is then complete at 806.

In order to increase laboratory throughput and to decrease exposure of laboratory workers to the hazardous reagents described herein, robotic systems which incorporate one or more of the components of the apparatus and/or the method steps may be employed. For example, robotic introduction of solutions (acidic or aqueous) into the containers, rotations of the substrate and/or pressurized grit expulsion nozzle and/or temperature control may be performed to enhance throughput of the treatment process. Thus, in one embodiment of the invention, the treatment process is performed by a robotic or automated system that has been developed for performing such a task.

FIG. 9A is a flow chart illustrating a method for treating a quartz surface in accordance with certain embodiments of the invention. FIG. 9B illustrates the quartz surface at various stages during the method of FIG. 9A. FIG. 9A and FIG. 9B are described with reference to each other.

In FIG. 9A, method 900 begins at operation 910 and proceeds to operation 255' to coarsely roughen the quartz surface from an initial roughness of about Ra 16 to a roughness of about Ra 400. As a result, the surface area of the quartz surface is increased. Surface 950 of FIG. 9B illustrates a surface roughness of about Ra 16. Surface 952 illustrates a surface of roughness of about Ra 400. According to certain embodiments, the quartz surface can be coarsely roughened by grit blasting the quartz surface using aluminum oxide or silicon carbide of grit size in the range of 36 to 100.

From operation 255', method 900 proceeds to operation 260' to perform a strong etch to further increase the roughness (and surface area) of the quartz surface to about Ra 600 and to remove micro cracks. Surface 954 of FIG. 9B illustrates a surface of roughness of about Ra 600. According to certain embodiments, a strong etch can be performed by etching the quartz surface for about 30 minutes to 60 minutes using an etching solution that includes hydrofloric acid, nitric acid and water in a ratio of 1:1:1. According to certain other embodiments, a strong etch can be performed by etching the quartz surface for about 120 minutes using an etching solution that includes hydrofloric acid, nitric acid and water in a ratio of 1:2:2.

From operation 260', method 900 proceeds to operation 235' to finely roughen the quartz surface to further increase the roughness (and surface area) to about Ra 600+ and to increase the adhesion or "stiction" of the contaminant layer on the quartz surface. According to certain embodiments, the quartz surface can be finely roughened by grit blasting the quartz surface using aluminum oxide or silicon carbide of grit size of about 220. Surface 956 of FIG. 9B illustrates a surface of roughness of about Ra 600+.

From operation 235', method 900 optionally proceeds to operation 240' to perform a weak etch to further increase the roughness (and surface area) of the quartz surface. Surface 958 of FIG. 9B illustrates a surface of roughness of about Ra 600+. According to certain embodiments, a weak etch can be performed by etching the quartz surface for about 2 minutes to 3 minutes using an etching solution that includes hydrofloric acid, nitric acid and water in a ratio of 1:3:3. According to certain other embodiments, a weak etch can be performed by etching the quartz surface for about 5 minutes to 10 minutes using an etching solution that includes hydrofloric acid, nitric acid and water in a ratio of 1:1:1. The method 900 ends at operation 960.

Although the invention has been described with respect to particular embodiments, it will be apparent to those skilled in the art that various changes and modifications can be made without departing from the invention. For example, the techniques and apparatus described above may be used in various combinations and other uses for the present invention are also contemplated. It is also noted that equivalents for the particular embodiments discussed in this description may be used in the invention as well.

The invention claimed is:

1. A method for treating a working surface of a quartz semiconductor manufacturing substrate comprising:
    preparing a quartz semiconductor manufacturing substrate to provide a working surface having an initial working surface roughness;
    ultrasonically acid-etching said working surface to increase said initial working surface roughness of said working surface by at least about 10%; and
    grit blasting said working surface after ultrasonically acid-etching said working surface with a fine grit having a mesh size greater than about 100.

2. A method for treating said working surface of said quartz semiconductor manufacturing substrate as recited in claim 1 wherein said fine grit has a mesh size greater than about 200.

3. A method for treating said working surface of said quartz semiconductor manufacturing substrate as recited in claim 1 wherein said acid-etching is a first acid-etching and further comprising a second acid-etching of said working surface after fine grit blasting said working surface.

4. A method for treating said working surface of said quartz semiconductor manufacturing substrate as recited in claim 3 wherein said first acid-etching removes substantially more material from said working surface than said second acid-etching.

\* \* \* \* \*